(12) United States Patent
Wu et al.

(10) Patent No.: US 6,246,119 B1
(45) Date of Patent: Jun. 12, 2001

(54) STRUCTURE OF A DUAL DAMASCENE

(75) Inventors: Juan-Yuan Wu, Hsinchu; Water Lur, Taipei, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/432,884

(22) Filed: Nov. 2, 1999

Related U.S. Application Data

(62) Division of application No. 09/165,703, filed on Oct. 2, 1998, now Pat. No. 6,097,093.

(30) Foreign Application Priority Data

Jul. 21, 1998 (TW) .............................................. 87111845

(51) Int. Cl.⁷ .............................................. H01L 23/535
(52) U.S. Cl. .............................................. 257/759
(58) Field of Search .............................. 257/632–650, 257/750–759

(56) References Cited

U.S. PATENT DOCUMENTS

| | | | |
|---|---|---|---|
| 5,442,237 | 8/1995 | Hughes et al. | 257/759 |
| 5,565,707 | 10/1996 | Colgen et al. | 257/750 |
| 5,659,201 | 8/1997 | Wollesen | 257/750 |

*Primary Examiner*—Nathan Flynn
*Assistant Examiner*—Remmon R. Fordé

(57) ABSTRACT

A dual damascene structure includes a semiconductor substrate, a metal-oxide-semiconductor (MOS) transistor formed on the substrate and a metal layer. The metal layer is electrically connected to the conducting regions of the MOS transistor through interconnect. The metal layer further includes first metal spacing regions and second metal spacing regions, wherein the width of a first metal spacing region is about 1 to 10 times of the linewidth of the device, and the width of a second spacing region is about 0.8 to 1.2 times of the linewidth of the device. The first metal spacing regions includes a high-permittivity dielectric for a better thermal transferring rate, and the second spacing regions includes a low-permittivity dielectric for a shorter resistance-capacitance delay.

4 Claims, 4 Drawing Sheets

STRUCTURE OF A DUAL DAMASCENE

CROSS-REFERENCE TO RELATED APPLICATION

This is a application of prior application Ser. No. 09/165,703 filed on Oct. 2, 1998, now U.S. Pat. No. 6,097,093, the disclosure of which is incorporated herein by reference.

This application claims the priority benefit of Taiwan application serial no. 87111845, filed Jul. 21, 1998, the full disclosure of which is incorporated herein by reference.

BACKGROUND OF THE INVENTION

1. Field of the Invention

This invention relates to a structure of a semiconductor device, and more particularly, to a dual damascene structure of a semiconductor device.

2. Description of the Related Art

As the integration of an integrated circuit (IC) increases, the number of interconnections used in an IC increases accordingly. In order to design a layout containing an increased number of interconnections, a layout that contains more than two metal layers has become a popular method for fabricating a semiconductor IC. Since the increased integration of an IC makes it more difficult to meet the requirements of the yield and reliability of interconnections, newer methods and structures have been developed and applied in the semiconductor fabrication process. The formation of a dual damascene includes forming trenches on dielectric layers, and then filling the trenches with metal, such as copper, that is difficult to pattern by an etching process. Because a dual damascene structure satisfies the requirement of low resistance and high electromigration, it has been widely used in the fabrication process of 0.25-$\mu$m or smaller very large scale integration (VLSI) devices for obtaining an efficient and reliable interconnection.

FIGS. 1A through 1C are schematic, cross-sectional views showing the formation process of a conventional dual damascene.

Referring to FIG. 1A, a first dielectric layer 30 is formed on a substrate 10 by a deposition process, such as a plasma enhanced chemical vapor deposition (PECVD) process. The substrate 10 already contains conducting regions 20 such as source/drain regions. Then, a patterned silicon nitride 50 is formed on the dielectric layer 30, wherein the patterned silicon nitride layer 50 contains openings 40 that expose a portion of the dielectric layer 30. The positions of the openings 40 respectively correspond to the positions of the conducting regions 20 underneath. A second dielectric layer 60 is next to be formed on the patterned silicon nitride layer 50.

Referring to FIG. 1B, an etching process is performed on the first dielectric layer 30 and the second dielectric layer 60 by using the silicon nitride layer 50 as a mask for the first dielectric layer 30 and the conducting regions 20 as an etching stop layer. A number of first via holes 70, which expose the conducting regions 20, and a number of second via holes 80, which are located above the silicon nitride layer 50, are formed by the foregoing etching process, wherein the etching process includes a dry etching process.

After that, with reference to FIG. 1C, a metal layer, such as copper, silver, aluminum, aluminum-silver alloy, or aluminum-copper alloy, is deposited on the second dielectric layer 60, and fills the first via holes 70 and the second via holes 80. Then, by performing a process such as an etching back process or a chemical mechanical polishing process, any portion of the deposited metal that is located on the top surface of the second dielectric layer 60 is removed to form a metal layer 90.

Generally, the first dielectric layer 30 and the second dielectric layer 60 include a high-permittivity material such as silicon dioxide or silicon nitride, which is an excellent heat transfer material. However, a high-permittivity material implies a large capacity, which worsens resistance-capacitance (RC) delay, This in turn slows down the operation of the semiconductor device and degrades the performance of the semiconductor device.

SUMMARY OF THE INVENTION

It is therefore an objective of the present invention to provide a dual damascene structure that is an excellent heat transfer material and hastens the operation of a semiconductor device.

In accordance with the foregoing and other objectives of the present invention, the invention provides a dual damascene structure that includes a semiconductor substrate, a metal-oxide-semiconductor (MOS) transistor formed on the substrate and a metal layer. The metal layer is electrically connected to the conducting regions of the MOS transistor through metal plugs. The metal layer further includes first metal spacing regions and second metal spacing regions, wherein the width of a first metal spacing region is about 1 to 10 times of the linewidth of the device, and the width of a second spacing region is about 0.8 to 1.2 times the linewidth of the device. The first metal spacing regions and the second spacing regions include different materials.

In accordance with the foregoing and other objectives of the present invention, he invention provides a partial reverse metal mask, wherein the partial reverse metal ask is used in an etching process for forming the second metal spacing regions.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new structure for a dual damascene that improves the performance and the reliability of a semiconductor device.

FIGS. 2A through 2D are schematic, cross-sectional views showing the formation process of a partial reverse metal mask used in a preferred embodiment according to the invention.

Figure 1A:
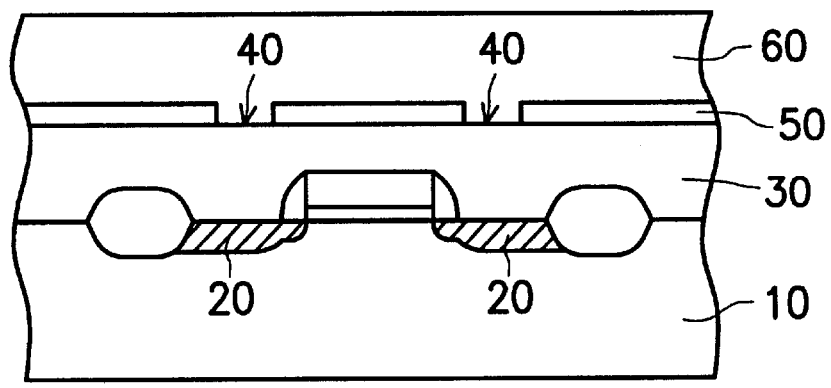
FIGS. 1A through 1C are schematic, cross-sectional views showing the formation process of a conventional dual damascene structure.
Figure 1B:
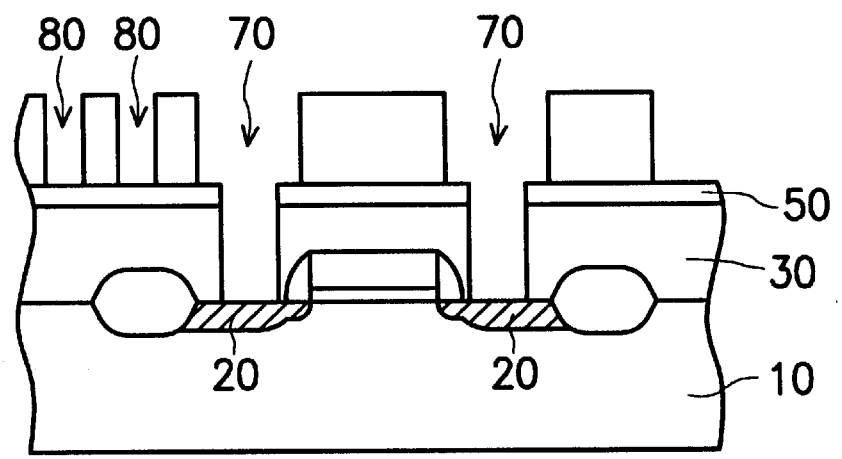
Figure 1C:
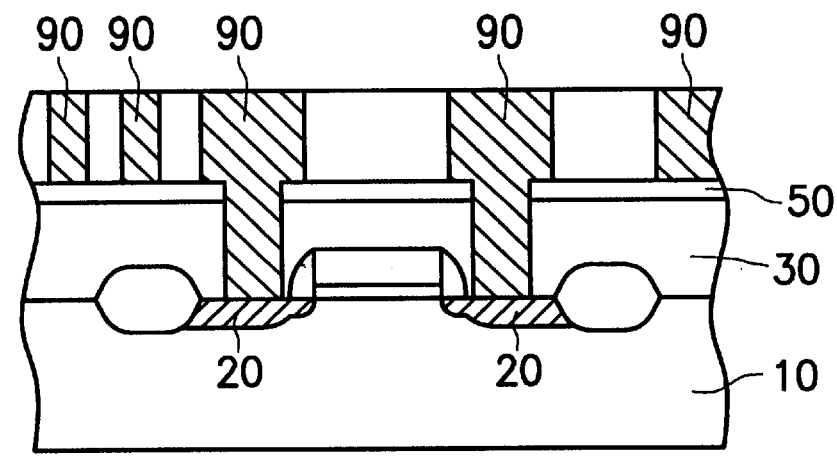
Figure 2A:
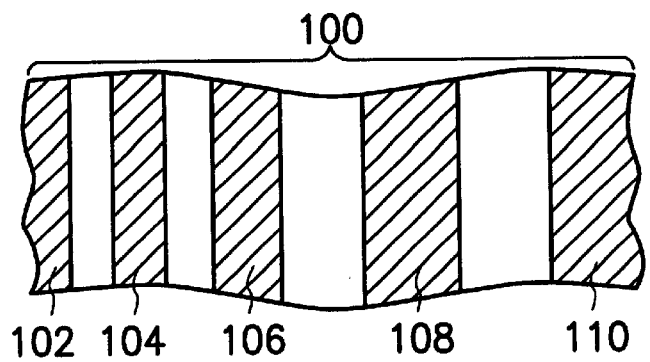
FIGS. 2A through 2D are schematic, top views showing the formation process of a partial reverse metal mask used in a preferred embodiment according to the invention.

Referring to FIG. 2A, a provided pattern 100 on a mask includes metal regions 102, 104, 106, 108, and 110, wherein the mask is used for patterning a metal layer by transferring the pattern 100 onto the metal layer.

Figure 2B:
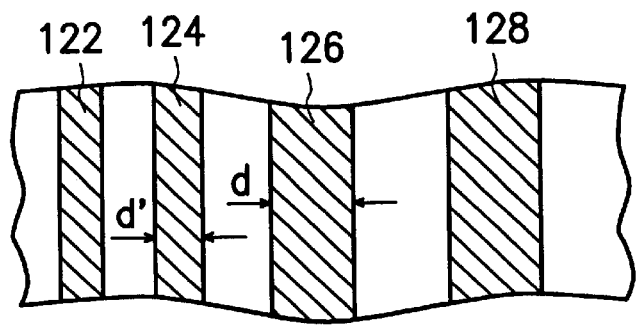

Referring next to FIG. 2B, narrower reverse metal regions 122 and 124 and wider reverse metal regions 126 and 128 are formed at the positions of non-metal regions and metal spacing regions, wherein a non-metal region is the region of the mask excluding the metal regions. The width of a wider reverse metal region, d, is about 1 to 10 times the linewidth of the device, and the width of a narrower reverse metal region, d', is about 0.8 to 1.2 times the linewidth of the device. Then, the metal regions 102, 104, 106, and 108 are removed. It is of note that any modification made on the mask of the invention is done by utilizing computer software on a computer.

Figure 2C:
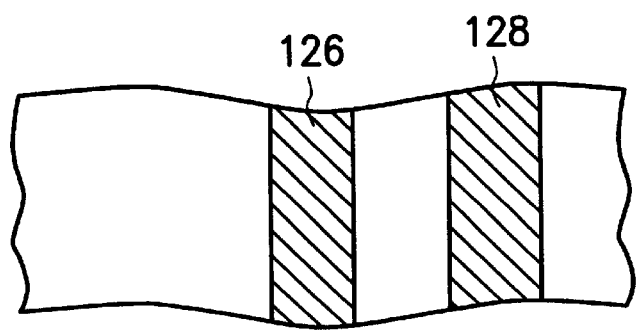

Referring to FIG. 2C, the widths of all reverse metal regions 122, 124, 126, and 128 are reduced by the width of a narrower reverse region, d', which is about 0.1 to 0.5 µm. Because of the resolution limitation on patterns, the narrower reverse regions 122 and 124 are removed.

Figure 2D:
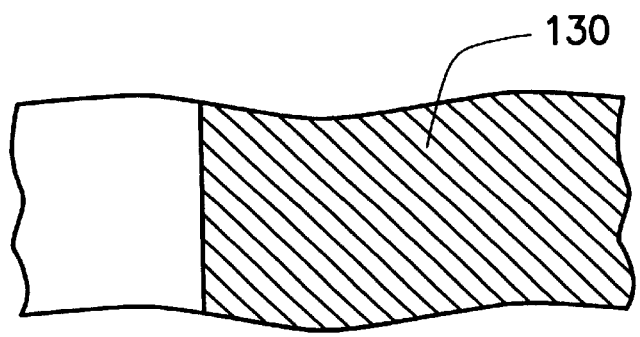

Referring to FIG. 2D, the widths of the remaining reverse metal regions 126 and 128 are then magnified by a value so that they are dovetailed to form a partial reverse metal region 130 to accomplish the fabrication of a partial reverse metal mask of the invention. The magnified width equals the width of a narrower reverse metal region, d' plus half of the width of the minimum metal region.

Since the foregoing partial reverse metal mask can also be made by conventional, fabricating methods known by people skilled in the art, no further discussion about the conventional method made.

A low-permittivity dual damascene of a preferred embodiment according to the invention is shown in FIGS. 3A through 3D.

Figure 3A:
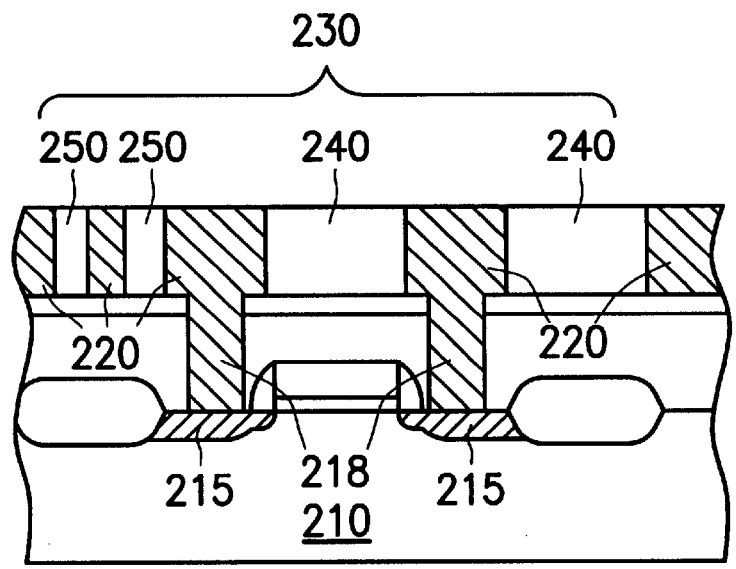
FIGS. 3A through 3D are schematic, cross-sectional views showing the formation process of a dual damascene structure of a preferred embodiment according to the invention.

As shown in FIG. 3A, a semiconductor substrate 210 including a conventional dual damascene structure contains a conducting layer 215, an interconnect 218, and a metal layer 220, wherein the metal layer 220 is electrically connected to the conducting layer 215 through the interconnect 218. The interconnect 218 includes polysilicon or metals. The metal layer 220 includes aluminum, silver, copper, aluminum-silver alloy, or aluminum-copper alloy. The metal layer 220 is formed on a patterned dielectric layer 230, wherein the dielectric layer 230 includes wider metal spacing regions 240 and narrower metal spacing regions 250. The dielectric layer 230 includes silicon dioxide or silicon nitride, wherein the permittivity of silicon dioxide is about 3.9 to 4.2, and the permittivity of silicon nitride is about 6 to 9. The width of a wider metal spacing region 240 is about 1 to 10 times the linewidth of the device, and the width of a narrower metal spacing region 250 is about 0.8 to 1.2 times the linewidth of the device.

Figure 3B:
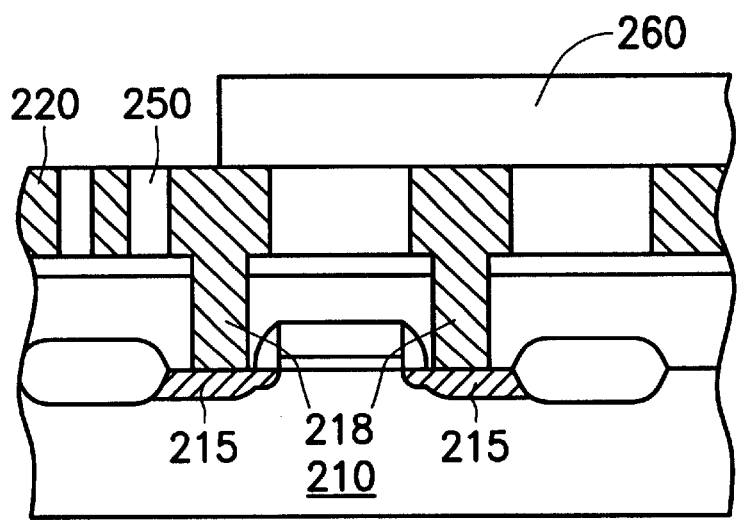

Referring to FIG. 3B, a photoresist layer 260 is patterned by using the partial reverse metal mask as shown in FIG. 2D, wherein the wider metal spacing regions 240 (FIG. 3A) and a neighboring metal region 220 are covered by the photoresist layer 260.

Figure 3C:
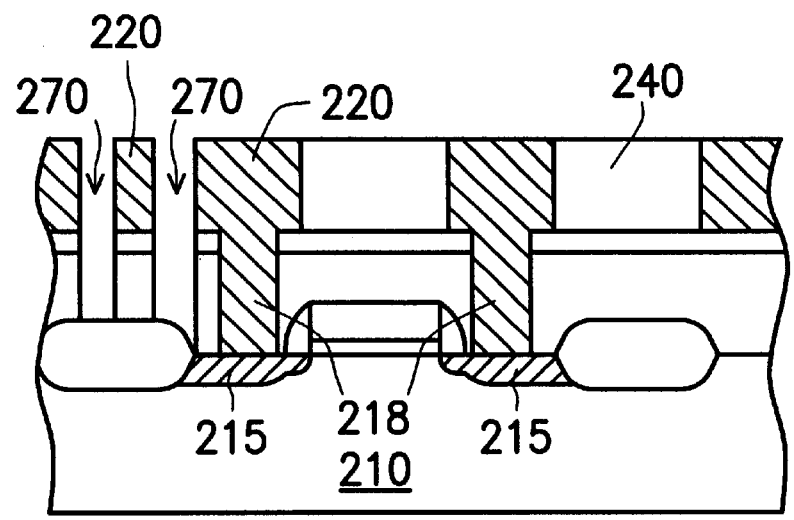

Referring next to FIG. 3C, an etching process, such as a dry etching process, is performed, in which dielectric from the narrower metal spacing regions 250 is removed to form openings 270 by using the photoresist layer 260 and metal regions 220 as masks.

Figure 3D:
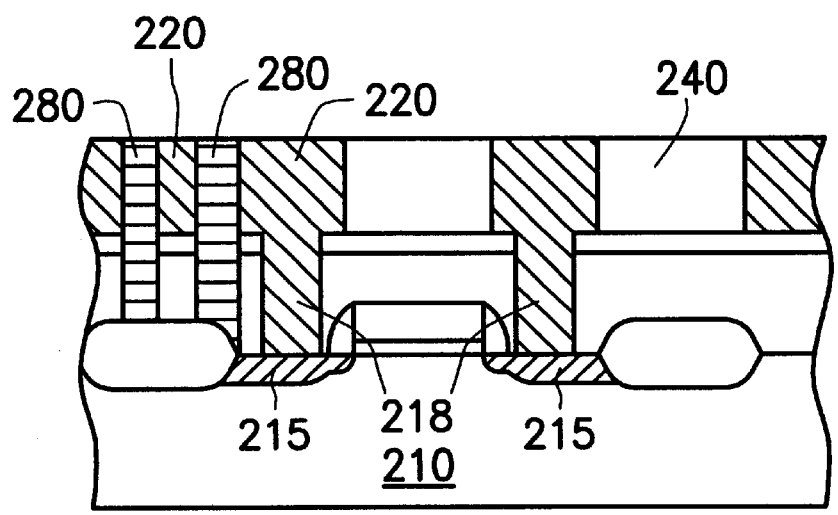

Referring to FIG. 3D, a low-permittivity dielectric layer 280, such as polyimide, is deposited to fill the openings 270 and cover substrate 210, wherein the permittivity of the dielectric layer 280 is less than 3.5. Then, by performing an etching back process or a chemical mechanical polishing process, the low-permittivity dielectric layer 280 that covers the metal spacing regions 240 and the metal regions 220 is removed.

According to the foregoing embodiment of the invention, high-permittivty dielectric forming the narrower metal spacing regions is replaced with low-permittivty dielectric by performance of a dry etching process and using a partial reverse metal mask. The dielectric forming the wider metal spacing regions remain unchanged. The specificity of the invention include:

1. Because the width of a portion of the metal layer 220 within the narrower metal spacing regions is about 0.8 to 1.2 times the linewidth of the device, the resistance on the portion of metal layer 220 is about 1 to 10 times the resistance of the metal layer 220 within the wider metal spacing regions 240. Even though the thermal transferring rate of the low-permittivity dielectric used in the narrower metal spacing regions 280 is lower, the low-permittivity dielectric 280 suppresses the RC delay to improve the operating speed of the device.

2. Since the power consumption rate of the metal layer 220 within the wider metal spacing regions 240 is higher, a material having a higher thermal transferring rate is needed for forming the metal spacing regions 240. Therefore, the original high-permittivity dielectric, which has a pretty good thermal transferring rate, is kept to ensure the reliability by utilizing a partial reverse metal mask.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A partial reverse metal mask comprising a first pattern for transferring a second pattern, which is converted from the first pattern, on a metal layer on a substrate, wherein the first pattern is corresponding to a layout of the metal layer, and wherein the metal layer comprises:

a plurality of first regions which are metal;

a plurality of second regions which are a plurality of first metal spacers wherein a width of the first region is about 1 to 10 times of a linewidth of a fabrication process to be performed; and a plurality of third regions, which are a plurality of second metal spacers, wherein a width of the second region is about 0.8 to 1.2 times of a linewidth of a fabrication process to be performed.

2. The partial reverse metal mask of claim 1, wherein the steps of converting the first pattern to form the second pattern comprises:

narrowing the first pattern till the third regions are erased; and widening the second regions till each of the second regions is connected to a neighboring second region of the second regions.

3. The partial reverse metal mask of claim 2, wherein the second regions and the third regions are narrowed by a first value of about 0.1 to 0.5 µm.

4. The partial reverse metal mask of claim 1, wherein the second regions are widened by a value equals to a sum of the first value and a width of a narrowest regions of the first regions interlacing with the second regions.

* * * * *